United States Patent [19]

Im

[11] Patent Number: 4,627,138
[45] Date of Patent: Dec. 9, 1986

[54] METHOD OF MAKING PIEZOELECTRIC/PYROELECTRIC ELEMENTS

[75] Inventor: Jang-hi Im, Midland, Mich.

[73] Assignee: The Dow Chemical Company, Midland, Mich.

[21] Appl. No.: 762,884

[22] Filed: Aug. 6, 1985

[51] Int. Cl.$^4$ .......................................... H01L 41/00
[52] U.S. Cl. .................................. 29/25.35; 29/573; 264/22; 264/104; 264/171; 310/800
[58] Field of Search ............... 29/25.35, 573; 310/800; 264/171, 104, 22

[56] References Cited

U.S. PATENT DOCUMENTS

| 3,884,606 | 5/1975 | Schrenk | 264/171 X |
| 4,328,441 | 5/1982 | Kroeger, Jr. et al. | 310/800 X |
| 4,585,701 | 4/1986 | Bartoszek et al. | 264/171 X |

Primary Examiner—Carl E. Hall
Attorney, Agent, or Firm—Michael L. Winkelman

[57] ABSTRACT

Multilayer coextruded piezoelectric/pyroelectric elements and method for manufacturing these elements are disclosed. The layer configuration of the element permits easy application of conductive material to two separate faces and thus prevents short-circuiting.

7 Claims, 5 Drawing Figures

4,627,138

METHOD OF MAKING PIEZOELECTRIC/PYROELECTRIC ELEMENTS

BACKGROUND OF THE INVENTION

1. Field of the Invention

This invention relates to piezoelectric/pyroelectric elements and a novel process for producing these elements.

2. Description of the Related Art

Piezoelectric materials are materials that produce an electric voltage when subjected to mechanical strain or in the reverse are mechanically deformed when they are subjected to an electric field. Pyroelectric materials are those materials which produce an electric voltage when heated.

This electric voltage is normally collected from the piezoelectric or pyroelectric material via a pair of electrodes connected to conducting wires and mounted upon two relevant faces of the material. In a reverse manner an electric field may be applied utilizing the conducting wires connected to the electrode pair.

It is now known that certain plastics substances can be made into films or sheets having a crystalline form which can be treated so as to become strongly piezoelectric or pyroelectric. A search of the literature will show that many polymers have been identified as potential piezoelectric or pyroelectric materials. One particular polymer is poly(vinyl difluoride), also known as polyvinylidene fluoride and often referred to as PVDF. Thin films of PVDF can be made strongly piezo- or pyroelectric by a process called poling in which the thin films are polarized. In this process a thin film is heated to near the softening temperature under tension, placed in a strong polarizing electric field, and allowed to cool slowly to room temperature while maintaining the electric field.

Piezoelectric and pyroelectric elements made from polarized polymers such as PVDF are of considerable interest in a number of fields. For example, a power generating plant could be designed using ocean waves for mechanical deformation of a large surface area of piezoelectric elements. Another use for piezoelectric elements is as transducers.

For some applications the sensitivity of a fully polarized polymeric piezoelectric/pyroelectric element is at least in theory increased with increasing film thickness. However due to thermally-activated electrical breakdown during the poling step of the polymeric film, extremely thick fully polarized polymeric films are difficult to produce and may not be thick enough to give the desired sensitivity.

U.S. Pat. No. 4,405,402 to Quilliam discloses a piezoelectric/pyroelectric element of an electrically polarized laminar stack of thin polarizable plastic films, each film essentially in face to face contact with its two neighboring films and the poling operation performed after assembling the individual plastic films.

U.S. Pat. No. 4,330,730 to Kurz et. al. disclose a wound piezoelectric material multilayered structure achieved by winding a flexible piezoelectric material film about an axis to produce a plurality of generally concentric piezoelectric layers. Both sides of the wound piezoelectric material film may be provided with conductive coatings which serve as electrodes prior to winding.

Multiple layer piezoelectric elements are attractive because of the large interfacial surface area of piezoelectric material from which generated charges can be collected.

However, the generation of a large number of layers of piezoelectric material is hardly possible without major secondary operations, such as lamination of individual plastic films or folding and winding a film about an axis to produce multiple layers.

The capability to produce relatively thin individual layers of piezoelectric/pyroelectric material having a consistant and uniform thickness, as thin as about 500 Angstroms (0.05 micron) also increases the efficiency of the poling operation through the use of the lower voltage to affect polarization and a shorter time period to achieve polarization.

Another problem with multilayer piezoelectric/pyroelectric elements, especially those produced by laminating individual plastic films, is the ease of establishing junction points so as to not produce a short-circuit.

Therefore, it would be highly desirable to provide a piezoelectric/pyroelectric element having multiple and relatively thin individual layers of piezoelectric/pyroelectric material having easily established junction points and a method for manufacturing the same.

SUMMARY OF THE INVENTION

The present invention is a piezoelectric/pyroelectric element comprising coextruded alternating layers of polymeric piezoelectric/pyroelectric material and polymeric electrode material and a process for manufacturing a piezoelectric/pyroelectric element. The polymeric electrode material in the piezoelectric/pyroelectric element is arranged so that a single edge of each successive layer of polymeric electrode material is alternatingly exposed to one of two separate faces of the piezoelectric/pyroelectric element. The single edges of the polymeric electrode material layers exposed on each of the two separate faces are then electrically interconnected with conductive material to which conducting wires are easily attached. A method for manufacturing this piezoelectric/pyroelectric element comprises the steps of coextruding the alternating layers of polymeric piezoelectric/pyroelectric material and polymeric electrode material in a manner so that a single edge of each successive layer of polymeric electrode material is alternatingly exposed to one of two separate faces of the piezoelectric/pyroelectric element, electrically interconnecting the exposed single edges of polymeric electrode material layers on each of the two separate faces with conductive material, attaching conducting wires to the conductive material and polarizing the polymeric piezoelectric/pyroelectric material.

The present invention is most beneficially employed in those applications requiring large interfacial piezoelectric material surface areas from which generated charges may be collected, and those applications in which large areas of piezoelectric material may be required.

DETAILED DISCUSSION OF AN ILLUSTRATIVE EMBODIMENT

Figure 1:
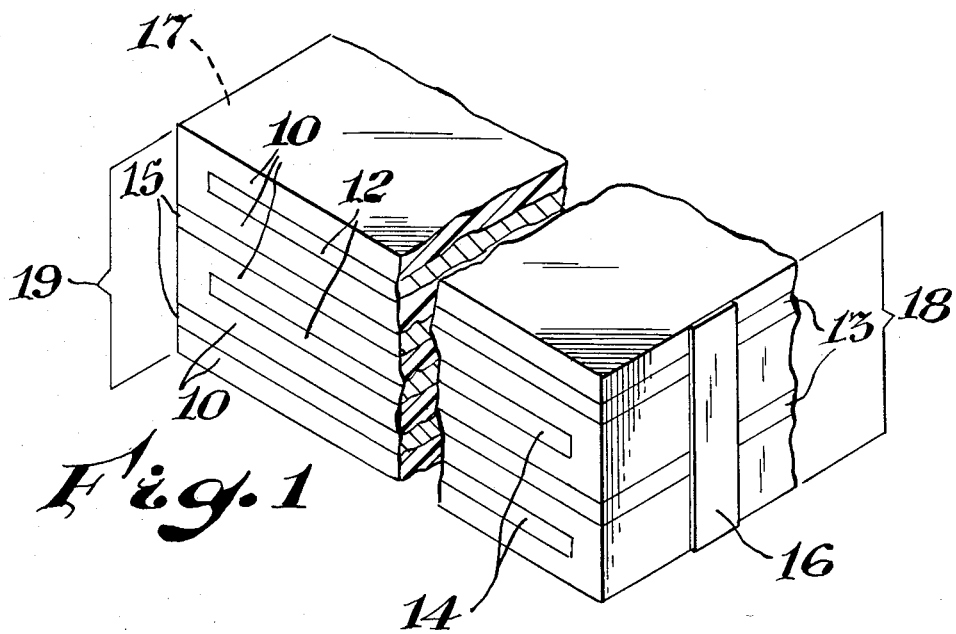
FIG. 1 illustrates a piezoelectric/pyroelectric element embodiment of the present invention.

As illustrated in FIG. 1, the piezoelectric/pyroelectric element of the present invention has alternating layers of polymeric piezoelectric/pyroelectric material (10) and polymeric electrode material (12, 14) with conductive material (16, 17) electrically interconnecting the single edges (13, 15) of polymeric electrode material layers exposed of each of the two separate faces (18, 19).

The polymeric piezoelectric/pyroelectric materials used in the present invention are those polymers which can be made into films or sheets and then treated so as to become piezoelectric or pyroelectric. While many polymers have been identified as piezoelectric or pyroelectric, one particular polymer which seems to have gained increasing usage is poly(vinyl difluoride) also known as polyvinylidene fluoride or PVDF. Thin films of PVDF may be made piezoelectric by the previously disclosed known poling process. Preferably, the films are heated under tension to an elevated temperature, generally in the range of 80° to 100° C. for PVDF, placed in a strong polarizing electric field, and then while still in the field allowed to cool slowly back to room temperature. Suitably, the electric field is about a million volts per centimeter of thickness of PVDF layers. For further details on the poling procedure of PVDF, reference is made to the disclosures of U.S. Pat. No. 3,894,198 and British Pat. No. 1,349,860.

The polymeric electrode material may suitably be a conductive polymer, a polymer or a blend of polymers rendered conductive which is extrudable. The polymeric electrode material also must be compatible or semicompatible with the piezoelectric/pyroelectric material so as to facilitate proper bonding. Examples of polymeric electrode materials are poly(methyl methacrylate) or poly(methyl acrylate) containing a conducting amount of one or more conductive fillers. These conductive fillers include, but are not limited to silver, copper, graphite or carbon block. For further details on conductive polymers, reference is made to the disclosure of U.S. Pat. No. 3,919,122, which is incorporated by reference.

The total number of alternating layers in a piezoelectric element is limited only by the coextrusion apparatus used to produce the alternating layer piezoelectric/pyroelectric element. Preferably the total number of alternating layers in the piezoelectric/pyroelectric element will range from about 20 to about 250. The number of piezoelectric/ pyroelectric material layers will be at least 10, more preferably 20, and most preferably at least 100.

The thickness of the polymeric piezoelectric/pyroelectric material layers is from about 0.05 micron to about 125 microns.

The polymeric electrode material layers may be as thin as possible without losing conductivity. Preferably the polymeric electrode material layer will be less than about 50 microns and most preferably the polymeric electrode material layer will be less than about 25 microns.

The width of the piezoelectric element may vary with the coextrusion apparatus utilized and the degree of drawdown during coextrusion but will preferably be from about 2.54 millimeters to about 1,270 millimeters (0.1 inches to 50 inches). Since coextrusion is a continuous process, the length may be varied as desired.

One particular apparatus for multilayer coextrusion of sheet or film which when modified is useful for the production of the piezoelectric element of the present invention is described in U.S. Pat. No. 3,884,606 to Schrenk, incorporated by reference.

Figure 2:
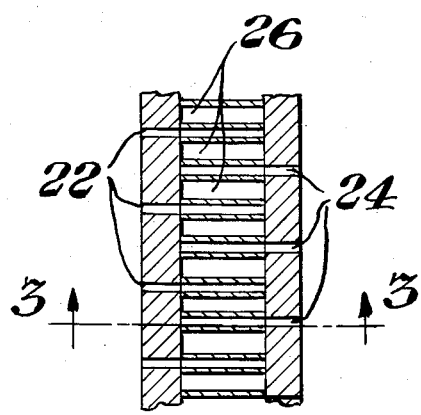
FIG. 2 illustrates a section of an existing feed distribution ring.
Figure 3:
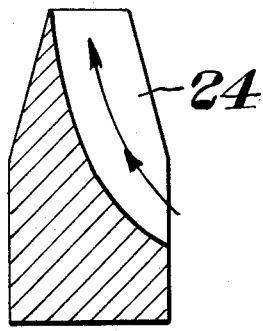
FIG. 3 is a cross-sectional illustration of a material feed slot shown in FIG. 2 taken along the section line 3—3.

FIG. 2 is an illustration of a section of a feed distribution ring also called a stream divider in U.S. Pat. No. 3,884,606, before modification. Slots 22 and 24 extend fully across slot 26. This is further illustrated by the cross-sectional view of FIG. 3 taken along line 3—3 of FIG. 2.

Figure 4:
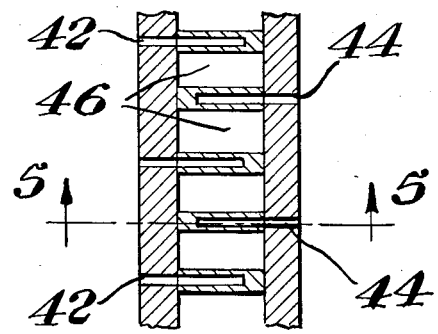
FIG. 4 illustrates a section of a modified feed distribution ring.
Figure 5:
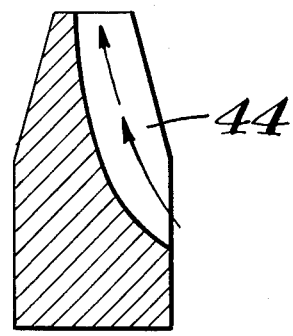
FIG. 5 is a cross-sectional illustration of a polymeric electrode material feed slot as shown in FIG. 4 taken along the section line 5—5.

FIG. 4 is an illustration of a section of the feed distribution ring after modification. Slots 42 and 44 do not extend fully across slot 46. This is further illustrated by the cross-sectional view of FIG. 5 taken along line 5—5 of FIG. 4. In the modified feed distribution ring slots 42 and 44 may be fed with the same or different polymeric electrode materials, while slot 46 is fed with polymeric piezoelectric/pyroelectric material.

By modifying the multilayer feed distribution ring so that a single edge of each successive layer of polymeric electrode material is alternatingly exposed to one of two separate faces of the piezoelectric/pyroelectric element an unpolarized piezoelectric element having a large number of layers may be generated without involving major secondary operations such as lamination and folding. One minor secondary operation which may be necessary and can easily be done on-line is the trimming of the two separate faces to expose the single edges of the layers of polymeric electrode material on each separate face.

The conductive material used to electrically interconnect the exposed single edges of the polymeric electrode material layers on each of the two separate faces may be of many types. Examples include, but are not limited to, solder, silver, other conductive metals, conductive polymers and polymers containing conductive fillers. The conductive material is preferably applied as a strip across each of the two separate faces so as to electrically interconnect all of the exposed single edges of polymeric electrode material layers on that particular separate face. Conducting wires are then attached, for example by solder, to these conductive strips. The unpolarized piezoelectric element is then ready for polarization.

EXAMPLE

Utilizing the apparatus for multilayer coextrusion as described in U.S. Pat. No. 3,884,606 with a feed distribution ring modified, as illustrated by FIG. 4, so that a single edge of each successive layer of polymeric electrode material is alternatingly exposed to one of two separate faces of the unpolarized piezoelectric element, an unpolarized piezoelectric element is produced having 249 total alternating layers. There are 125 layers of PVDF having a thickness of 0.05 micron. There are 124 layers of poly(methyl acrylate) containing enough carbon black to render the poly(methyl acrylate) conductive. The width of the unpolarized piezoelectric element is about 600 millimeters.

A narrow strip of silver paste is applied to each of the two separate faces of the unpolarized piezoelectric element so as to electrically interconnect all of the exposed single edges of polymeric electrode material layers on that separate face. After allowing the paste to dry, conducting wires are attached to these conductive materials strips of silver with solder.

Conventional poling is then performed by applying an electric field through the conducting wires, the piezoelectric element being at elevated temperatures and under tension. The electric field is then maintained for a period of time while the piezoelectric/pyroelectric element is allowed to cool to ambient temperatures.

This multilayer piezoelectric/pyroelectric element which is produced in a continuous coextrusion operation will, after poling, produce an electric voltage.

The present invention has been described in detail with reference to certain preferred embodiments. It should be understood however that variations and modifications of the present invention may be within the spirit and scope of the invention.

I claim:

1. A method for manufacturing a piezoelectric element comprising the steps of:
   (a) coextruding alternating layers of
      (1) polymeric piezoelectric meterial; and
      (2) polymeric electrode material arranged
         so that a single edge of each successive layer of polymeric electrode material is alternatingly exposed to one of two separate faces of the piezoelectric element;
   (b) electrically interconnecting on each of the two separate faces the exposed single edges of polymeric electrode material layers with conductive material; and
   (c) polarizing the polymeric piezoelectric material.

2. A method for manufacturing a piezoelectric element, as recited in claim 1, further comprising the step of attaching conducting wires to the conductive material present on each of the two separate faces prior to polarization.

3. A method for manufacturing a piezoelectric element, as recited in claim 1, wherein the coextruded polymeric piezoelectric material comprises at least 20 layers.

4. A method for manufacturing a piezoelectric element, as recited in claim 1, wherein the coextruded polymeric piezoelectric material comprises at least 100 layers.

5. A method for manufacturing a piezoelectric element, as recited in claim 1, wherein the coextruded polymeric piezoelectric material is polyvinylidene fluoride.

6. A method for manufacturing a piezoelectric element, as recited in claim 1, wherein the coextruded layers of the polymeric piezoelectric material have a thickness of from about 0.05 micron to about 125 microns and the coextruded layers of the polymeric electrode material have a thickness less than about 50 microns.

7. A method for manufacturing a piezoelectric element, as recited in claim 1, wherein the coextruded layers of the polymeric piezoelectric material have a thickness of from about 0.05 micron to about 125 microns and the coextruded layers of the polymeric electrode material have a thickness less than about 25 microns.

* * * * *